(12) United States Patent
Nale et al.

(10) Patent No.: US 12,147,698 B2
(45) Date of Patent: Nov. 19, 2024

(54) HIGH PERFORMANCE MEMORY MODULE WITH REDUCED LOADING

(71) Applicant: Intel Corporation, Santa Clara, CA (US)

(72) Inventors: Bill Nale, Livermore, CA (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 647 days.

(21) Appl. No.: 17/214,770

(22) Filed: Mar. 26, 2021

(65) Prior Publication Data

US 2021/0216238 A1 Jul. 15, 2021

(51) Int. Cl.
*G06F 3/00* (2006.01)
*G06F 3/06* (2006.01)

(52) U.S. Cl.
CPC .......... *G06F 3/0655* (2013.01); *G06F 3/0604* (2013.01); *G06F 3/0673* (2013.01)

(58) Field of Classification Search
CPC .. G06F 13/1673; G06F 12/00; G06F 12/0623; G06F 13/1694; G06F 1/06; G06F 1/10; G06F 1/12; G06F 11/1044; G06F 11/1048; G06F 13/4068; G06F 3/0604; G06F 3/0655; G06F 3/0673; G06F 3/0679; G06F 3/0619; G06F 3/0659; G06F 3/065; G06F 8/60; G06F 8/65; G06F 1/3275; G06F 13/1689; G06F 2212/1032; G06F 3/0629; G06F 11/1068; G06F 12/0804; G06F 1/24; G06F 11/004; G06F 11/1012; G06F 11/22; G06F 11/221; G06F 13/1668; G06F 3/0635; G06F 9/4401; G06F 9/4406; G06F 1/28; G06F 12/1433; G06F 13/1678; G06F 11/1417; G06F 13/4234; G06F 2212/1052; G06F 3/061; G06F 3/0614; G06F 3/0656; G06F 1/266; G06F 11/1004; G06F 11/1032; G06F 13/1636; G06F 13/4282; G06F 3/0611; G06F 3/0647; G06F 3/0683; G06F 9/30029; G06F 11/102; G06F 11/14; G06F 11/1456; G06F 11/1469; G06F 11/2284;
(Continued)

(56) References Cited

U.S. PATENT DOCUMENTS 8,272,781 B2 9/2012 Nale
9,342,453 B2 5/2016 Nale et al.
(Continued)

*Primary Examiner* — Thong Q Le
(74) *Attorney, Agent, or Firm* — Compass IP Law PC

(57) ABSTRACT

An apparatus is described. The apparatus includes a register clock driver (RCD) semiconductor chip having first inputs to receive first command and address (CA) signals from a first sub-channel and first outputs to drive first and second instances of the CA information that are decoded from the first CA signals. The RCD semiconductor chip has second inputs to receive second command and address (CA) signals from a second sub-channel. The RCD semiconductor chip has a multiplexer having a first input channel to receive the first CA signals and a second input channel to receive the second CA signals. The RCD semiconductor chip has second outputs to drive third and fourth instances of the first CA information or first and second instances of the second CA information that are decoded from the second CA signals depending on which of the first and second input channels of the multiplexer is selected.

20 Claims, 6 Drawing Sheets

(58) Field of Classification Search
CPC ............. G06F 12/0238; G06F 12/0246; G06F 12/0653; G06F 13/16; G06F 17/16; G06F 2212/70; G11C 11/4096; G11C 5/04; G11C 5/06; G11C 8/06; G11C 8/12; G11C 11/4076; G11C 11/408; G11C 11/4093; G11C 7/22; G11C 7/24

See application file for complete search history.

(56) References Cited

U.S. PATENT DOCUMENTS

| | | |
|---|---|---|
| 9,619,408 B2 | 4/2017 | Nale et al. |
| 9,990,246 B2 | 6/2018 | Nale et al. |
| 10,146,711 B2 | 12/2018 | Nale et al. |
| 10,693,686 B2 * | 6/2020 | Shi .................... G06F 13/1673 |
| 2016/0147678 A1 | 5/2016 | Nale |
| 2017/0249266 A1 | 8/2017 | Nale et al. |
| 2017/0278562 A1 | 9/2017 | Nale |
| 2017/0285941 A1 | 10/2017 | Nale et al. |
| 2017/0289850 A1 | 10/2017 | Nale et al. |
| 2018/0189207 A1 | 7/2018 | Nale et al. |
| 2019/0018809 A1 | 1/2019 | Nale et al. |
| 2019/0066759 A1 | 2/2019 | Nale |
| 2019/0066808 A1 | 2/2019 | Nale |
| 2019/0073161 A1 | 3/2019 | Nale |

\* cited by examiner

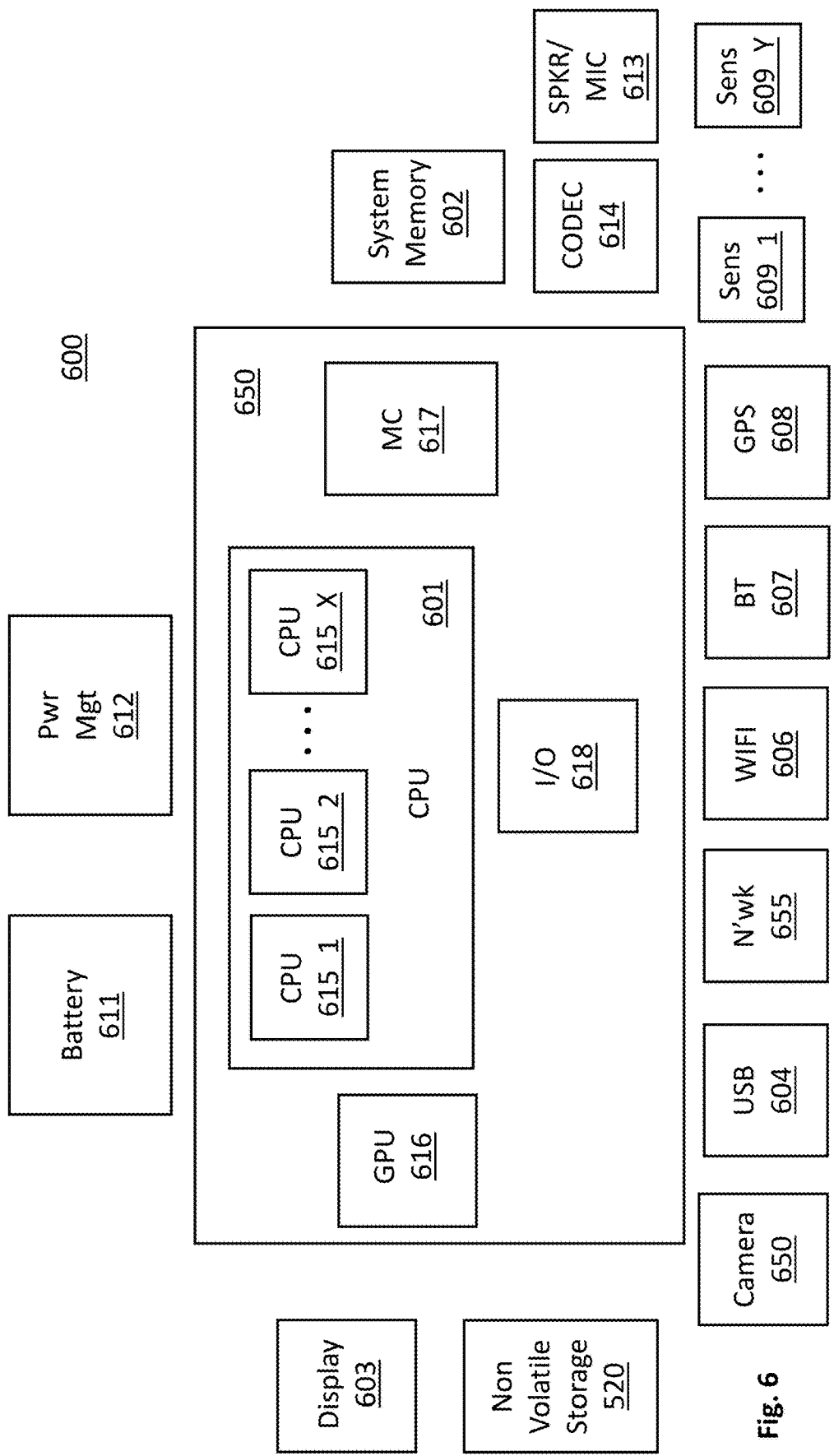

HIGH PERFORMANCE MEMORY MODULE WITH REDUCED LOADING

FIELD OF INVENTION

The field of invention pertains generally to the computing sciences, and, more specifically, to a high performance memory module with reduced loading.

BACKGROUND

With the emergence of "big data", artificial intelligence and other high performance applications, the ability to integrate high performance memory with small form factor and/or less expensive memory chips is becoming an increasingly important consideration of system designers.

FIGURES

Figure 1:
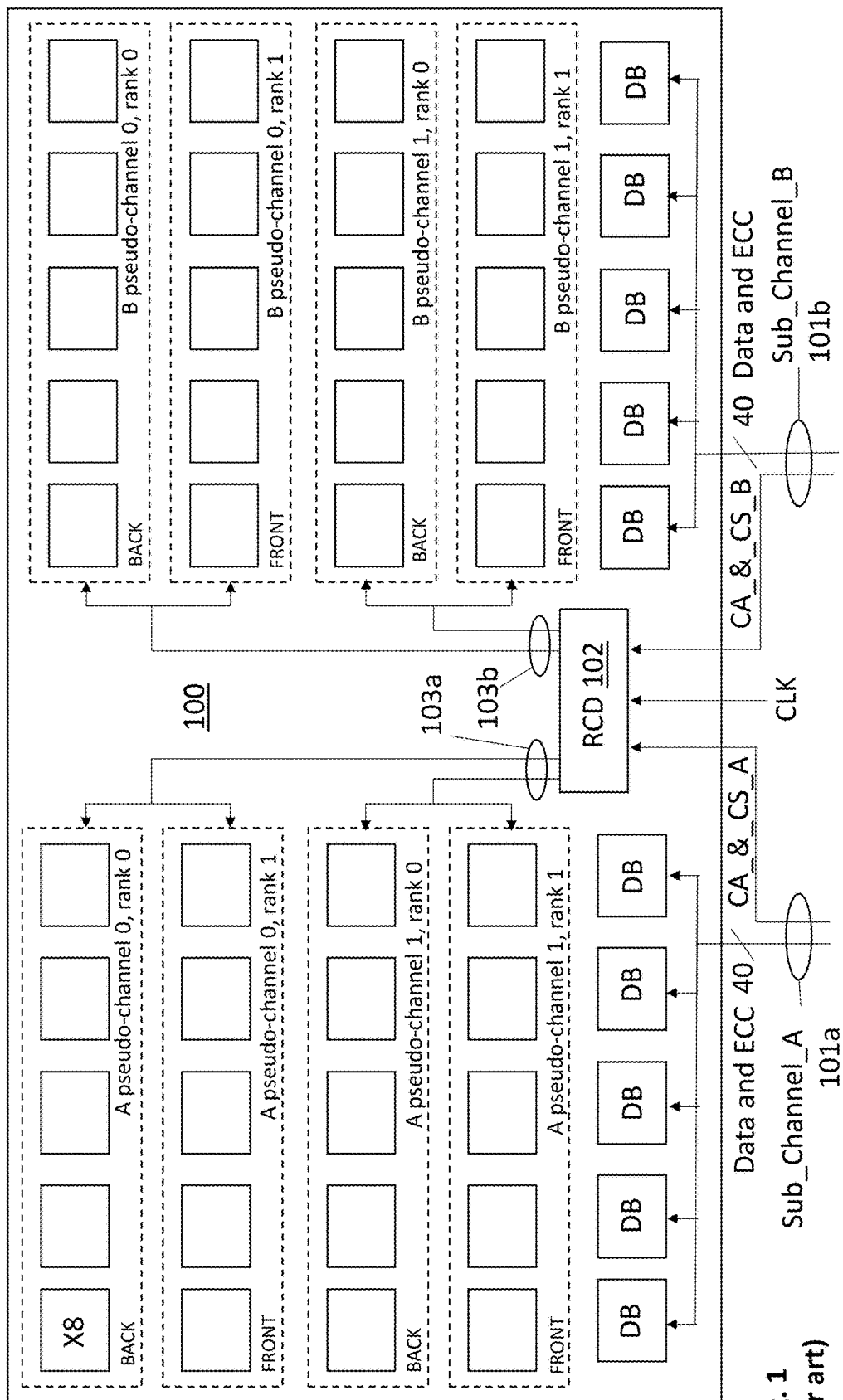
Figure 2:
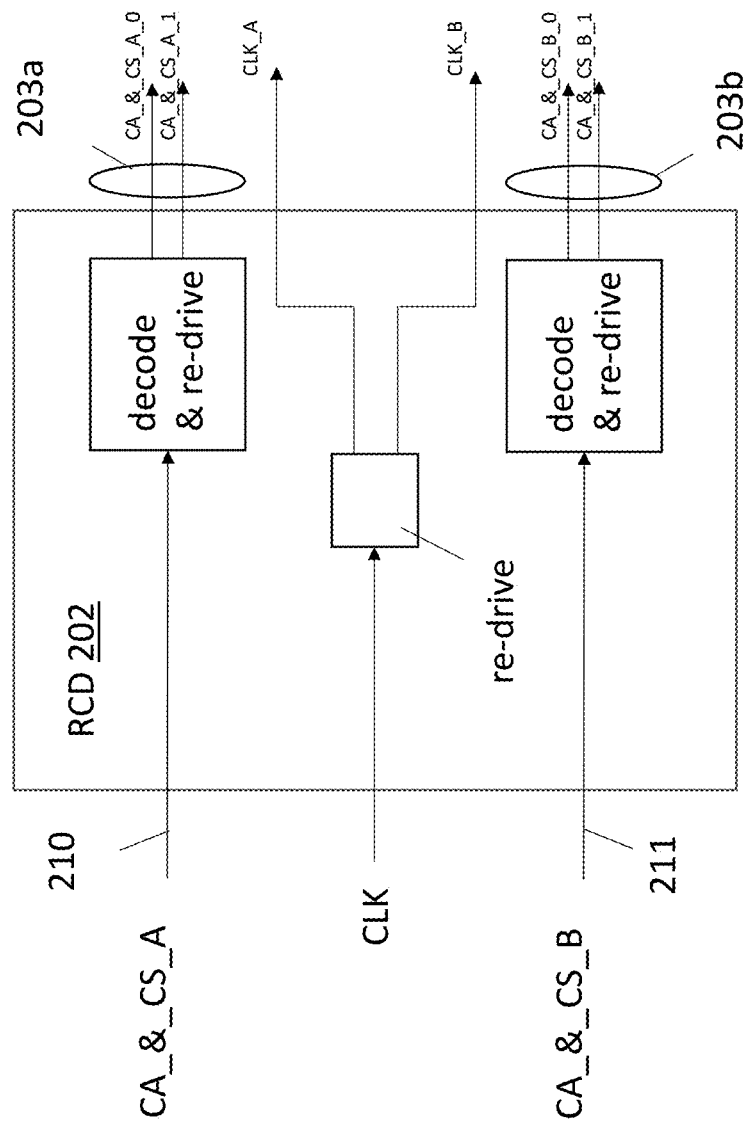
Figure 3:
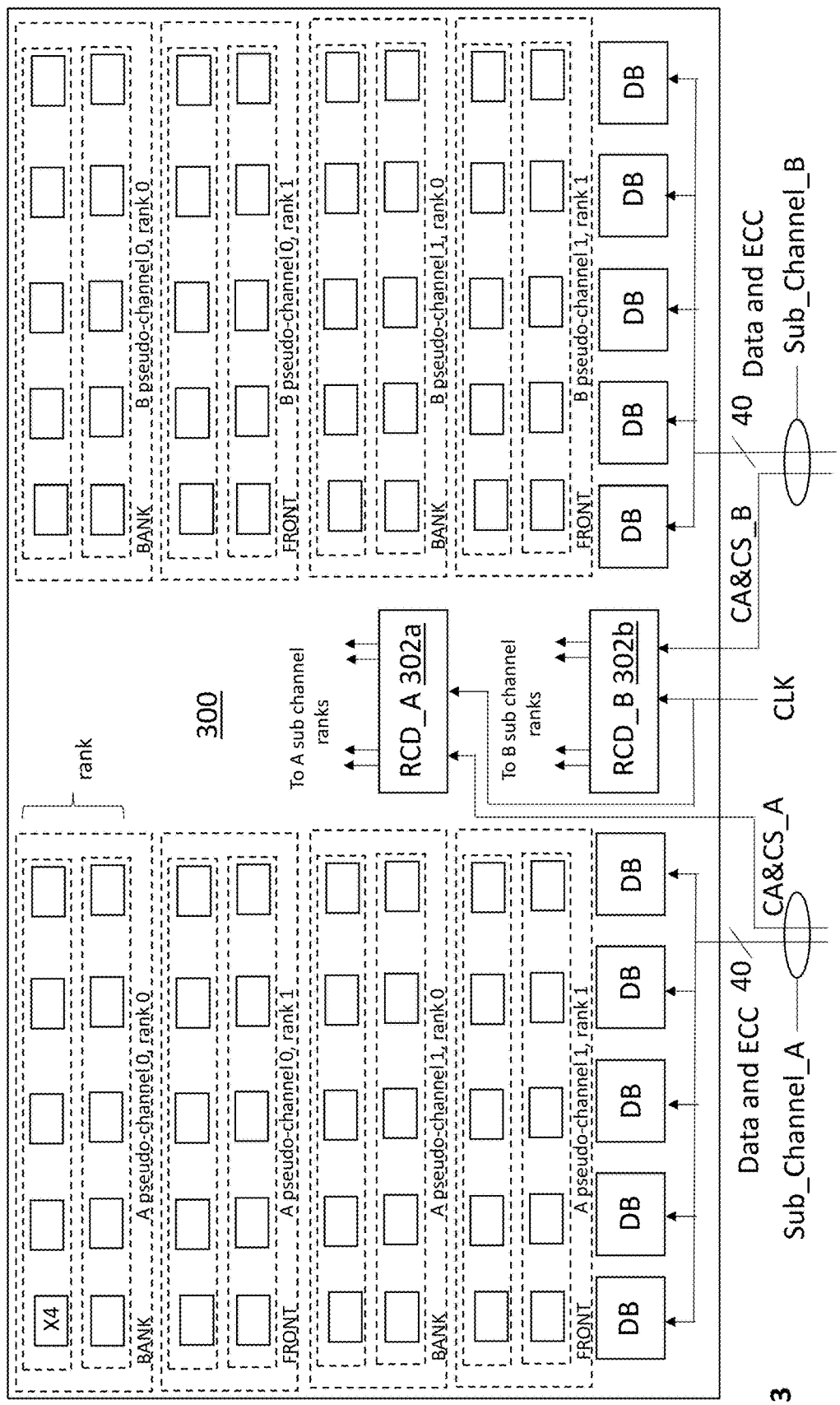
Figure 4:
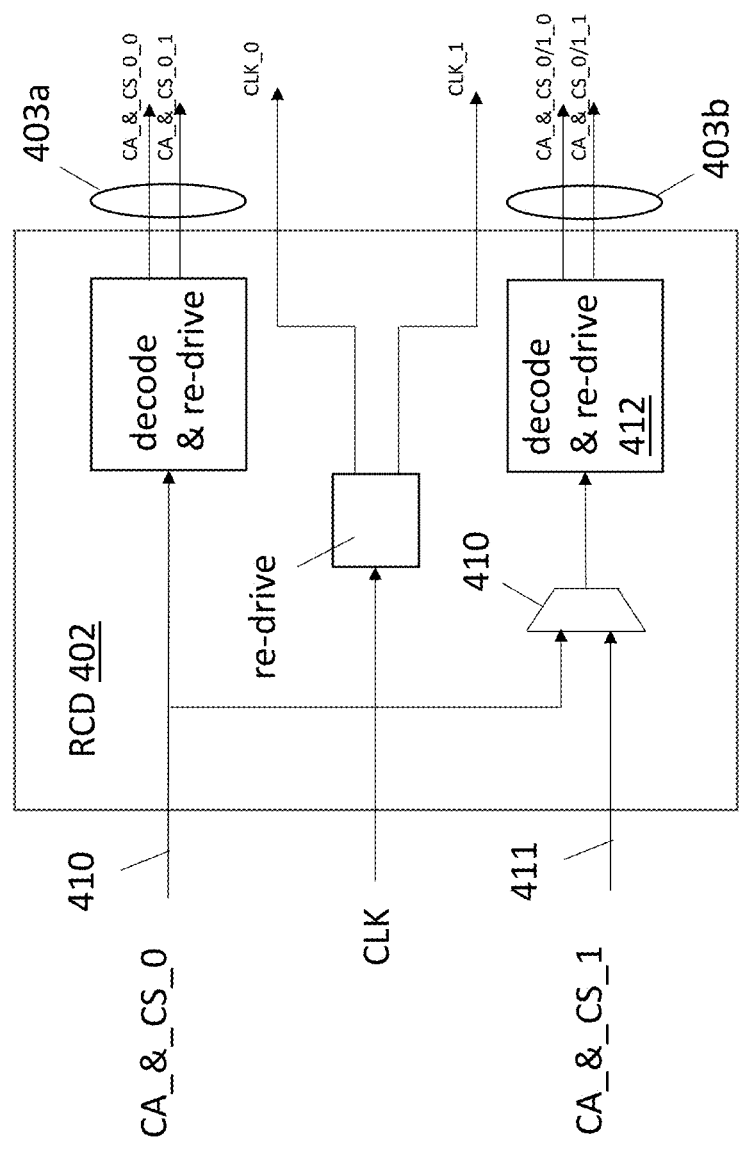
Figure 5:
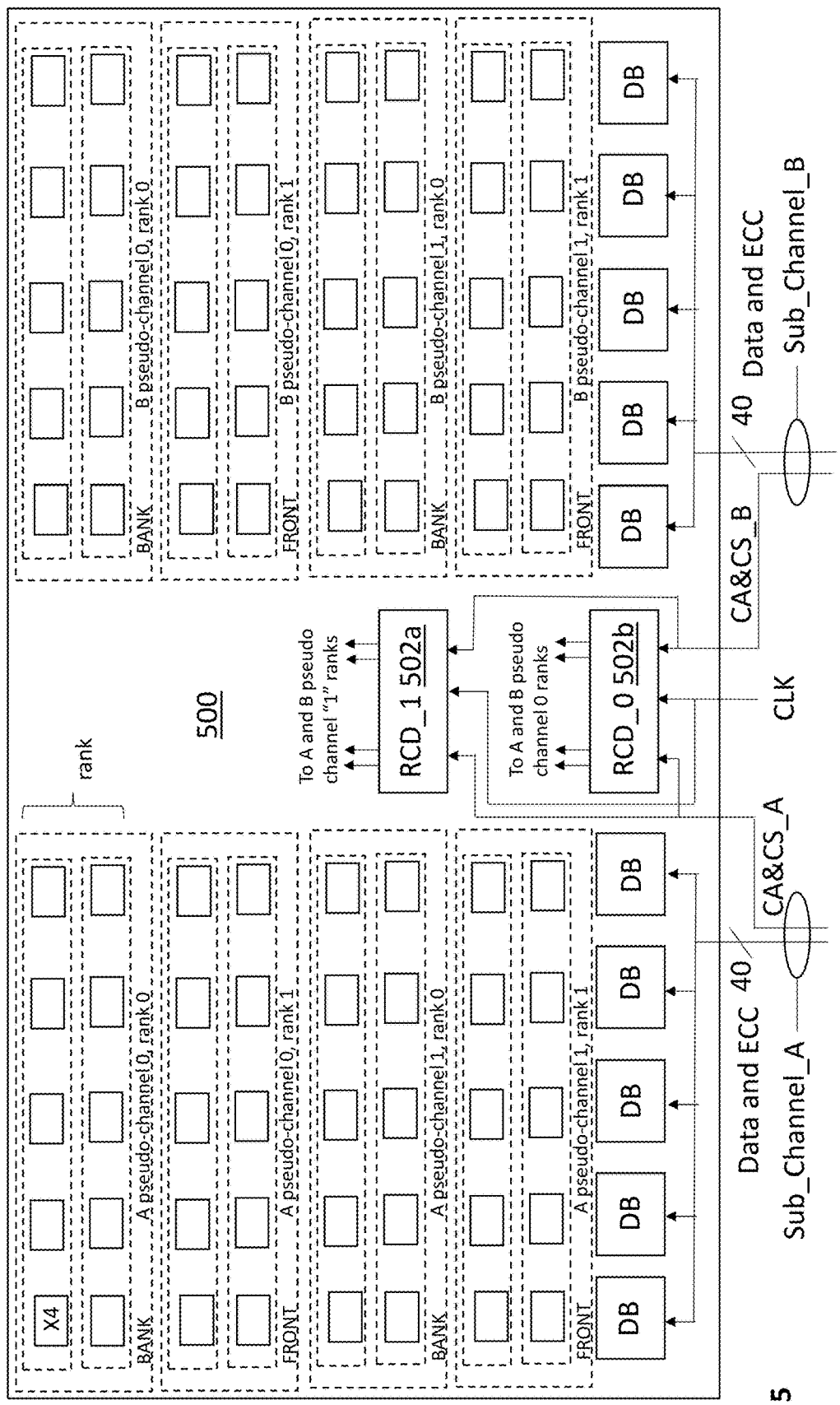

A better understanding of the present invention can be obtained from the following detailed description in conjunction with the following drawings, in which:

FIG. 1 (prior art) shows a DDR5 DIMM;
FIG. 2 (prior art) shows an RCD chip of the DDR5 DIMM of FIG. 1;
FIG. 3 shows an improved memory module;
FIG. 4 shows an improved RCD chip of the improved memory module;
FIG. 5 shows another memory module;
FIG. 6 shows a computing system.

DESCRIPTION

FIG. 1 shows a prior art quad rank DDR5 dual in-line memory module (DIMM) 100 implemented with X8 memory chips. As is known in the art, a single Joint Electron Device Engineering Council (JEDEC) dual data rate 5 (DDR5) channel is composed of two separate sub-channels (an "A" sub-channel 101a and a "B" sub-channel 101b). Each of the A and B sub-channels include a respective 40 bit (b) wide data bus and command/address and chip ("CA_&_CS") signal lines (the 40b data bus includes 32b of data and 8b of error correction code (ECC)). A single clock signal (CLK) is also provided for both sub channels.

Each of the A and B sub-channels 101a, 101b can be further divided into two additional pseudo channels where each pseudo channel provides for two ranks of memory chips that implement a DDR5 data interface. Here, as observed in FIG. 1, for each sub-channel (A or B) a first pair of ranks 0, 1 are associated with a first pseudo channel 0 and a second pair of ranks 0, 1 are associated with a second pseudo channel 1. In a common implementation, for each pair of ranks per pseudo channel, one of the ranks is disposed on one side of the DIMM (e.g., a front side) and the other one of the ranks is disposed on the other side of the DIMM (e.g., a back side). These are labeled "FRONT" and "BACK" respectively in FIG. 1.

A memory transaction over the A sub-channel 101a can therefore target any one of the four different ranks associated with the pair of A pseudo channels, and, likewise, a memory transaction over the B sub-channel 101b can therefore target any one of the four different ranks associated with the pair of B pseudo channels. Multiplexers associated with each data buffer ("DB") steer data to/from a physical sub-channel from/to the correct rank for any particular memory transaction. For ease of illustration the data paths between the data buffers and their respective ranks is not shown.

As depicted in FIG. 1, the DIMM 100 includes a single register clock driver (RCD) chip 102. As observed in FIG. 1, each sub-channel 101a, 101b has its own dedicated command/address (CA) and chip select (CS) signals ("CA_&_CS"). The single RCD chip 102 receives the CA and CS signals for the A sub-channel 101a, and decodes and drives two instances of them 103a to the memory chips of the two pseudo channels that are coupled to the A pseudo channel (with respect to the decode, each instance of CA bits is implemented with 7 bits of encoded CA information on physical sub-channel and 14 bits of decoded CA information on the RCD output side).

Likewise, the single RCD chip 102 receives the CA and CS signals for the B sub-channel, and decodes and drives two instances of them to the memory chips of the two pseudo channels that are coupled to the B sub-channel. Here, CA and CS signals that are driven to a particular pseudo channel are received by the memory chips of both ranks of that pseudo channel. The RCD chip 102 also replicates and fans out the clock (CLK) to each of the eight ranks of memory chips on the DIMM 100.

FIG. 2 shows the design of the RCD 202. As observed in FIG. 2, the CA and CS signals for sub-channel A are received at a first set of input nodes 210. The CA and CS signals are then decoded and driven as two different instances/sets of "A side" CA and CS output signals 203a. The two different instances of A-side CA and CS output signals 203a are coupled to the memory chips of different, respective ones of the pseudo channels that are coupled to the A sub-channel (one set of output signals is driven to the memory chips of one pseudo channel and the other set of output signals is driven to the memory chips of the other pseudo channel).

Likewise, the CA and CS signals for sub-channel B are received at a first set of input nodes 210. The CA and CS signals are then decoded and driven as two different instances/sets of "B side" CA and CS output signals 203b. The two different instances of B-side CA and CS output signals 203a are coupled to the memory chips of different, respective ones of the pseudo channels that are coupled to the B sub-channel.

Because the DIMM 100 of FIG. 1 uses X8 memory chips, each rank consists of only five memory chips (8b/chip×5 chips=40b). Thus, each separate set of CA and CS signals that is sent to the memory chips of a particular pseudo channel experiences the load of ten memory chips. The load of ten memory chips is acceptable in view of DDR5's stringent timing requirements.

A problem arises, however, if X4 memory chips are used in place of X8 memory chips. In this case, twenty memory chips are needed to implement a single pseudo channel, or, ten memory chips are needed per rank. That is, because the data width per memory chip is halved, the total memory chip count per rank needs to be doubled to realize a 40b wide data bus for each rank. Unfortunately, if the design approach of FIG. 1 is adopted, doubling the number of memory chips unacceptably increases the loading on each of the CA and CS signal wires that are individually routed to each memory chip of a particular pseudo channel.

FIG. 3 shows a DIMM 300 that adds a second RCD to double the number of CA and CS signals on the DIMM 300 as compared to the approach of FIG. 1. By doubling the number of CA and CS signals on the DIMM 300, there are two sets of CA and CS signals per pseudo channel: a first set of CA and CS signals that is routed to the pseudo channel's first rank of ten X4 memory chips, and, a second set of CA and CS signals that is routed to the pseudo channel's other, second rank of ten X4 memory chips.

Importantly, adding the second RCD does not add additional loading to the physical sub-channel's CA and CS signal wires. Here, referring back to FIG. 1, note that the CA and CS signals for both the A sub-channel 101a and the B sub-channel 101b experience only a single load (the load of the single RCD chip 102). Referring to FIG. 3, the CA and CS signals for both the A and B sub-channels remain terminated by only one load at the DIMM. However, whereas these signals are terminated by the same RCD chip 102 in the approach of FIG. 1, they are terminated by different RCD chips 302a, 302b in the approach of FIG. 3.

FIG. 4 shows an improved RCD chip design 402 that can be used for either the X8 DIMM 100 of FIG. 1, or, the X4 DIMM 300 of FIG. 3. Here, comparing FIGS. 2 and 4, note that the second set of CA and CS input signals 411 are intercepted by multiplexers 410 before being decoded and re-driven. In the case where the RCD 402 of FIG. 4 is to be used as the single RCD 102 in the X8 DIMM of FIG. 1, the multiplexers 410 are set to select the second set of CA input signals 411 and the RCD 402 operates no differently than the RCD 202 of FIG. 2.

By contrast, in the case where the RCD 402 of FIG. 4 is to be used for each of the RCDs 302a, 302b in the X4 DIMM 300 of FIG. 3, the multiplexers 410 are set to select the first set of CA and CS signals 410. By selecting the first set of CA and CS signals 410, the second decode and driver circuit 412 will drive $3^{rd}$ and $4^{th}$ instances of the first set of CA and CS signals 410.

By designing the DIMM 300 such that one of the RCDs 302a receives the A sub-channel's CA and CS signals at the first set of CA and CS inputs 410 while the other one of the RCDs 302b receives the B sub-channel's CA and CS signals at the first set of CA and CS inputs 410, one of the RCDs 302a will generate four sets of CA and CS signals from the A sub-channel, while the other of the RCDs 302b will generate four sets of CA and CS signals from the B sub-channel. As discussed above, the four sets of CA and CS signals from the A channel are respectively driven to the four ranks of the A channel's two pseudo channels. Likewise, the four sets of CA and CS signals from the B channel are respectively driven to the four ranks of the B channel's two pseudo channels.

As depicted in FIG. 3, the X4 DIMM introduces an extra load to the CLK input with respect to the X8 DIMM of FIG. 1. In cases where the extra load risks integrity of the CLK signal, the CLK is received at only one of the RCDs and is re-driven to the other RCD. Alternatively, the physical sub-channels can be enhanced to include separate CLK signals for the A and B sub-channels. In this case the CLK signal associated with the A sub-channel is received only by the RCD 302a that is associated with the A sub-channel and the RCD 302b that is associated with the B sub-channel.

With respect to register space of the RCD (e.g., mode register (MR) space), the traditional RCD of FIG. 2 has "A" side register space (that sets parameters associated with the A sub-channel) and "B" side register space (that sets parameters associated with the B sub-channel). The A side register space is accessed via the CS bits from the A sub-channel and the B side register space is accessed via the CS bits from the B sub-channel. In this case, either of the bits (CS[0] or CS[1]) from a particular sub-channel can be used to access the sub-channel's associated register space (A side for A sub-channel and B side for B sub-channel).

By contrast, according to an embodiment of the improved RCD of FIG. 4, the improved RCD of FIG. 4 also has A side and B side registers that, in one mode of operation (e.g., X8 DIMM mode), operate as described above. However, in another mode of operation (e.g., X4 DIMM mode), the A-side registers (which are now associated one of the pseudo channels) are reached through one of the CS bits (e.g., CS[0]) while the B-side registers (which are now associated with the other of the pseudo channels) are reached through the other one of the CS bits (e.g., CS[1]).

As is known in the art, the inclusion of an RCD and data buffers (DBs) on a single DIMM corresponds to a load reduced DIMM (LRDIMM). The use of pseudo channels extends the LRDIMM architecture to an extended LRDIMM (eLRDIMM) architecture. Other embodiments may choose to obviate the data buffers and one pseudo channel per sub-channel to produce a quad rank registered DIMM (RDIMM) having two ranks of X4 memory chips per sub-channel. In this case, four separate chip select states could be utilized per sub-channel (one chip select state per half rank of memory chips). Here, the pair of chip selects (CS[0] and CS[1]) can be used to express the four different chip select states.

FIG. 5 shows another LRDIMM X4 embodiment where the RCDs 502a, 502b are configured to have A and B sides like the RCD 202 of FIG. 2. Here, one RCD 502a drives the CA and CS bits for the A and B sub-channels' "0" pseudo channel and the other RCD 502b drives the CA and CS bits for the A and B sub-channels' "1" pseudo channel. In this case, the memory controller on the host side will have to spread commands across both the A and B sub-channels to reach pseudo channels coupled to a same sub-channel.

Although embodiments above have stressed a DIMM form factor, other memory module form factors can be used such as memory modules having stacked memory chips.

Although embodiments above has stressed JEDEC DDR5 implementation, other memory implementations, both JEDEC and non JEDEC compliant can implement the teachings provided above. The RCD semiconductor chip described above can be implemented with hardwired logic circuitry and programmable logic circuitry.

FIG. 6 provides an exemplary depiction of a computing system 600 (e.g., a smartphone, a tablet computer, a laptop computer, a desktop computer, a server computer, etc.). As observed in FIG. 6, the basic computing system 600 may include a central processing unit 601 (which may include, e.g., a plurality of general purpose processing cores 615_1 through 615_X) and a main memory controller 617 disposed on a multi-core processor or applications processor, system memory 602 (also referred to as main memory), a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_Y, one or more cameras 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618 (e.g., I/O control hub or peripheral control hub (PCH)). The general purpose processing cores 615 typically execute the operating system and application software of the computing system. The graphics processing unit 616 typically executes graphics intensive functions to, e.g., generate graphics information that is presented on the display 603. The main memory controller 617 interfaces with the system memory 602 to write/read data to/from system memory 602. The system memory (or other memory controller and memory) may be implemented with the memory module as described above.

The power management control unit 612 generally controls the power consumption of the system 600. Each of the touchscreen display 603, the communication interfaces 604-607, the GPS interface 608, the sensors 609, the camera(s) 610, and the speaker/microphone codec 613, 614 all can be viewed as various forms of I/O (input and/or output) relative to the overall computing system including, where appropriate, an integrated peripheral device as well (e.g., the one or more cameras 610). Depending on implementation, various ones of these I/O components may be integrated on the applications processor/multi-core processor 650 or may be located off the die or outside the package of the applications processor/multi-core processor 650. The computing system also includes non-volatile storage 620 which may be the mass storage component of the system (e.g., a hard disk drive, a solid state drive, etc.).

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMS, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

An apparatus is described. The apparatus includes a register clock driver (RCD) semiconductor chip having first inputs to receive first command and address (CA) signals from a first sub-channel and first outputs to drive first and second instances of the CA information that are decoded from the first CA signals. The RCD semiconductor chip has second inputs to receive second command and address (CA) signals from a second sub-channel. The RCD semiconductor chip has a multiplexer having a first input channel to receive the first CA signals and a second input channel to receive the second CA signals. The RCD semiconductor chip has second outputs to drive third and fourth instances of the first CA information or first and second instances of the second CA information that are decoded from the second CA signals depending on which of the first and second input channels of the multiplexer is selected.

In various embodiments the RCD semiconductor chip is compatible for both: a) a first dual in-line memory module (DIMM) implemented with X8 memory chips; and, b) a second DIMM implemented with X4 memory chips. In further embodiments the first and second DIMMs are JEDEC DDR5 DIMMs.

In various embodiments the first and second sub-channels are JEDEC DDR5 sub-channels. In various embodiments the RCD further includes a clock signal input and first and second clock signal outputs. In various embodiments the RCD further includes register space, wherein, a first portion of the register space is accessible through a first chip select (CS) bit and a second portion of the register space is accessible through a second CS bit.

In further embodiments the first inputs are further to receive first CS information, the first outputs are further to drive first and second instances of the CS information, the second inputs are further to receive second CS information, and the second outputs are further to drive the first and second instances of the first CS information or first and second instances of the second CS information depending on which of the first and second input channels of the multiplexer is selected.

A memory module having the RCD semiconductor chip described above has also been described. The memory module has first, second, third and fourth ranks of memory chips to implement first and second pseudo channels of the first sub-channel. Each of the first, second, third and fourth ranks of the memory chips are to receive its CA information as a different one of the instances of the first CA information.

In various embodiments the memory module is a DIMM. In various embodiments the memory chips are X4 memory chips. In various embodiments the DIMM is a JEDEC DDR5 DIMM.

A computing system has been described. The computing system includes a plurality of processing cores; a memory controller coupled to the processing cores; and a memory module as described above coupled to the memory controller by way of a first memory channel and a second memory channel.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a register clock driver (RCD) semiconductor chip having first inputs to receive first command and address (CA) signals from a first sub-channel and first outputs to drive first and second instances of first CA information that is decoded from the first CA signals, the RCD semiconductor chip having second inputs to receive second command and address (CA) signals from a second sub-channel, the RCD semiconductor chip comprising a multiplexer having a first input channel to receive the first CA signals and a second input channel to receive the second CA signals, the RCD semiconductor chip comprising second outputs to drive third and fourth instances of the first CA information or first and second instances of second CA information that is decoded from the second CA signals depending on which of the first and second input channels of the multiplexer is selected.

2. The apparatus of claim 1 wherein the RCD semiconductor chip is compatible for both:

a) a first dual in-line memory module (DIMM) implemented with X8 memory chips;
b) a second DIMM implemented with X4 memory chips.

3. The apparatus of claim 2 wherein the first and second DIMMs are JEDEC DDR5 DIMMs.

4. The apparatus of claim 1 wherein the first sub-channel and the second sub-channel are JEDEC DDR5 sub-channels.

5. The apparatus of claim 1 wherein the RCD further comprises a clock signal input and first and second clock signal outputs.

6. The apparatus of claim 1 wherein the RCD further comprises register space, wherein, a first portion of the register space is accessible through a first chip select (CS) bit and a second portion of the register space is accessible through a second CS bit.

7. The apparatus of claim 1 wherein the first inputs are further to receive first CS information, the first outputs are further to drive first and second instances of the first CS information, the second inputs are further to receive second CS information, and the second outputs are further to drive third and fourth instances of the first CS information or first and second instances of the second CS information depending on which of the first and second input channels of the multiplexer is selected.

8. An apparatus, comprising:
a memory module comprising a) and b) below:
a) a register clock driver (RCD) semiconductor chip having first inputs to receive first command and address (CA) signals from a first sub-channel and first outputs to drive first and second instances of first CA information that is decoded from the first CA signals, the RCD semiconductor chip having second inputs to receive second command and address (CA) signals, the RCD semiconductor chip comprising a multiplexer having a first input channel to receive the first CA signals and a second input channel to receive the second CA signals, the RCD semiconductor chip comprising second outputs to drive third and fourth instances of the first CA information because the first input channel of the multiplexer is to be selected;
b) first, second, third and fourth ranks of memory chips to implement first and second pseudo channels of the first sub-channel, each of the first, second, third and fourth ranks of the memory chips to receive its CA information as a different one of the instances of the first CA information.

9. The apparatus of claim 8 wherein the memory module is a DIMM.

10. The apparatus of claim 9 wherein the memory chips are X4 memory chips.

11. The apparatus of claim 10 wherein the DIMM is a JEDEC DDR5 DIMM.

12. The apparatus of claim 8 wherein the RCD further comprises a clock signal input and first and second clock signal outputs.

13. The apparatus of claim 8 further comprising register space, wherein, a first portion of the register space is accessible through a first chip select (CS) bit and a second portion of the register space is accessible through a second CS bit.

14. The apparatus of claim 8 wherein the first inputs are further to receive first CS information, the first outputs are further to drive first and second instances of the first CS information, the second inputs are further to receive second CS information, and the second outputs are further to drive the third and fourth instances of the first CS information because the first input channel of the multiplexer is to be selected.

15. A computing system, comprising:
a plurality of processing cores;
a memory controller coupled to the processing cores;
a memory module coupled to the memory controller by way of a first memory channel and a second memory channel, the memory module comprising a) and b) below:
a) a register clock driver (RCD) semiconductor chip having first inputs to receive first command and address (CA) signals from a first sub-channel and first outputs to drive first and second instances of first CA information that is decoded from the first CA signals, the RCD semiconductor chip having second inputs to receive second command and address (CA) signals, the RCD semiconductor chip comprising a multiplexer having a first input channel to receive the first CA signals and a second input channel to receive the second CA signals, the RCD semiconductor chip comprising second outputs to drive third and fourth instances of the first CA information because the first input channel of the multiplexer is to be selected;
b) first, second, third and fourth ranks of memory chips to implement first and second pseudo channels of the first sub-channel, each of the first, second, third and fourth ranks of the memory chips to receive its CA information as a different one of the instances of the first CA information.

16. The computing system of claim 15 wherein the memory module is a DIMM.

17. The computing system of claim 16 wherein the memory chips are X4 memory chips.

18. The computing system of claim 17 wherein the DIMM is a JEDEC DDR5 DIMM.

19. The computing system of claim 15 wherein the RCD further comprises a clock signal input and first and second clock signal outputs.

20. The computing system of claim 15 further comprising register space, wherein, a first portion of the register space is accessible through a first chip select (CS) bit and a second portion of the register space is accessible through a second CS bit.

* * * * *